US009401593B2

(12) United States Patent
Gascuel

(10) Patent No.: US 9,401,593 B2
(45) Date of Patent: Jul. 26, 2016

(54) DEVICE FOR MONITORING AND PROTECTING THE POWER SUPPLY OF ELECTRICAL EQUIPMENT AND METHOD FOR IMPLEMENTING SAID DEVICE

(76) Inventor: Jacques Gascuel, Boulognes sur Gesse (FR)

(*) Notice: Subject to any disclaimer, the term of this patent is extended or adjusted under 35 U.S.C. 154(b) by 1029 days.

(21) Appl. No.: 12/695,434

(22) Filed: Jan. 28, 2010

(65) Prior Publication Data

US 2010/0188785 A1 Jul. 29, 2010

Related U.S. Application Data

(60) Provisional application No. 61/159,528, filed on Mar. 12, 2009.

(30) Foreign Application Priority Data

Jan. 28, 2009 (FR) ...................................... 09 00366

(51) Int. Cl.
H02H 7/00 (2006.01)
H02H 3/02 (2006.01)
H02H 3/04 (2006.01)
H03K 17/082 (2006.01)
H02H 3/10 (2006.01)

(52) U.S. Cl.
CPC ................ H02H 3/023 (2013.01); H02H 3/04 (2013.01); H02H 3/10 (2013.01); H03K 17/082 (2013.01)

(58) Field of Classification Search
CPC .............................. H02H 3/10; H03K 17/082
USPC .......................................................... 361/18
See application file for complete search history.

(56) References Cited

U.S. PATENT DOCUMENTS

| 3,359,434 | A | | 12/1967 | Galluzzi |
| 4,061,956 | A | * | 12/1977 | Brown et al. ................. 320/153 |
| 4,535,282 | A | * | 8/1985 | Nguyen ........................ 323/269 |
| 4,566,052 | A | | 1/1986 | Kammiller |
| 5,296,797 | A | * | 3/1994 | Bartlett ........................ 320/145 |
| 5,768,496 | A | * | 6/1998 | Lidgett et al. ................... 714/25 |
| 5,959,816 | A | | 9/1999 | Wood et al. |
| 7,031,130 | B2 | | 4/2006 | Simonelli et al. |
| 7,800,869 | B1 | * | 9/2010 | Daugherty ...................... 361/18 |
| 2006/0275655 | A1 | * | 12/2006 | Shirane ......................... 429/121 |

FOREIGN PATENT DOCUMENTS

FR 2 666 901 3/1992
FR 2 830 379 4/2003

* cited by examiner

Primary Examiner — Stephen W Jackson
Assistant Examiner — Ann Hoang
(74) Attorney, Agent, or Firm — Young & Thompson

(57) ABSTRACT

A device for monitoring and protecting electrical equipment, placed in series on a power supply line between an electrical power source and the equipment, includes:
at least one voltage regulator for regulating a power supply voltage of the equipment,
at least one current limiter, coupled to the voltage regulator to reduce the power supply voltage of the equipment if a power supply current absorbed by the equipment exceeds an upper operating value,
at least one crowbar short-circuit device, adapted to be activated when the input voltage exceeds a safety limit value, higher than the upper operating value, and to cause a fuse placed in series between the power source and the equipment, to blow, and calculating and storage elements adapted to generate a clock and to log a date of occurrence of a fault and the operating parameters of the power supply for the equipment in a non-volatile memory.

12 Claims, 2 Drawing Sheets

DEVICE FOR MONITORING AND PROTECTING THE POWER SUPPLY OF ELECTRICAL EQUIPMENT AND METHOD FOR IMPLEMENTING SAID DEVICE

The invention relates to a device for monitoring and protecting the electrical power supply of electrical equipment enabling faults occurring in the power supply to be identified and logged in order to identify their cause and, if appropriate, the persons responsible. The invention also relates to a method for implementing such a device.

Current electrical and electronic systems—such as computers, for example—are formed from a number of interconnected devices and powered from the mains supply through a stabilised power supply that provides each device (motherboard, processor, disks, etc.) with a power source that is adapted to its characteristics with regard to voltage, current, etc.

Any failure or fault in this power supply could have catastrophic consequences for the devices connected to it. Even though the consequence in most cases is the destruction of the device, leading to its replacement and a related cost limited to the cost of the equipment, there are nevertheless cases in which the cost of the equipment represents only a very small part of the costs incurred. For example, the failure of a hard disk or database could result in loss of data with serious operational and financial repercussions. Even though possibilities exist—albeit limited ones—for recovering certain data, these, too, are extremely costly to implement. The failure of other equipment could likewise result in operating loss with equally serious consequences.

Numerous devices for protecting electrical equipment are known, such devices also being capable of protecting the power source supplying them, such as—for example—from document FR 2 830 379, which discloses a protective device for a load and for its electrical power source, comprising a voltage limitation circuit and a current limitation circuit that are able to operate also as consumed power limitation circuit. Nevertheless, other faults in the load power supply could occur for which this device is not intended, such as—for example—an overvoltage that would exceed the maximum voltage value that the switch of this device is able to block. Furthermore, despite the efficiency of protective devices, it is still possible that a failure will occur in the device being protected.

The victims of this type of loss are therefore inclined to turn to insurance policies to cover this risk or to ascertain whoever might be accountable in order to claim compensation. However, in the prior art, it is very difficult subsequently to determine the cause of such loss and to ascertain the persons responsible, since the failure of a device may be due to the device itself or may indeed be caused by external factors such as a fault in the electrical power supply of the equipment, or by abnormal environmental conditions.

There is therefore a need for a device that not only enables the extent to which an appliance is protected to be improved, but also enables the circumstances of any fault or failure that occurs to be logged in detail.

The object of the invention is therefore to provide a device for monitoring and protecting electrical equipment that enables said equipment to be protected against a wide range of power supply faults.

Another object of the invention is to provide a device that is also capable of protecting the power source against any fault induced by a failure in the protected equipment.

A further object of the invention is to provide a device that is capable of monitoring and, in a reliable and permanent manner, of logging and backing up certain parameters representing the power supply and the environment of the protected equipment when a fault occurs.

A further object of the invention is to provide a device capable of being connected, in a reliable and permanent manner, to the electrical equipment that it is intended to monitor and protect, such that the authenticity of events that have occurred in said electrical equipment, and have been determined according to the parameters registered in the device, is incontestable.

A further object of the invention is to provide a device for monitoring and protecting electrical equipment that enables detected faults to be reported locally and remotely if applicable.

A further object of the invention is to provide a device that can be used to support and to provide evidence in a new, more effective and efficient insurance service for damage that may affect the protected electrical equipment.

For this purpose, the invention relates to a device for monitoring and protecting electrical equipment, said device being placed in series on a power supply line between an electrical power source and said electrical equipment, comprising:
   at least one voltage regulator adapted for regulating a power supply voltage of the equipment when an input voltage delivered by the power source is between a lower and an upper operating value, and to cut off this power supply voltage when the input voltage is outside said operating values,
   at least one current limiter, coupled to the voltage regulator, and adapted for reducing the power supply voltage of the equipment if a power supply current absorbed by said equipment exceeds an upper operating value,
   at least one crowbar short-circuit device, adapted to be activated when the input voltage exceeds a safety limit value, greater than the upper operating value and causing a fuse placed in series between the power source and the electrical equipment to blow, and
   means of calculation and storage adapted for generating a clock and for registering a date of occurrence of a fault and operating parameters of the power supply for the device in a non-volatile memory.

Even if the electrical power source is a power supply unit said to be stabilized, additional protective means that are coupled together enable any failures in the power supply unit or consequences of electrical problems that may occur on electrical equipment supplied in parallel to be alleviated. Thus the voltage regulator only supplies the protected equipment if the input voltage is within normal operating limits, the current limiter cooperates with the voltage regulator to limit the power supply voltage of the equipment if the latter absorbs excess current revealing an internal breakdown such as a short-circuit, and—if an overvoltage on a level that is capable of damaging the electrical equipment and/or the voltage regulator were to occur on the power supply line—the circuit breaker formed by the fuse and the crowbar short-circuit device would isolate the device and electrical equipment together by interrupting the power supply line between the power source and the device. In the case of electrical equipment comprising a plurality of power supply lines (for several power supply voltages, for example), each line comprises a set of protective means (voltage regulator, current limiter, crowbar short-circuit device) which is linked to the common means of calculation and storage. Outside the reinforced protection provided by the inventive device, the latter comprises means enabling the occurrence of a fault to be dated and logged, and for measures relating to operating parameters—such as the input voltage, the power supply voltage for the equipment and the current consumed by said equipment—to be logged, thus enabling the nature of the fault to be determined. The data gathered is advantageously logged in a non-volatile memory, which is preferably non-modifiable such that it may be reread even if the device and the equipment that it protects are destroyed, and used for determining who, if anyone, is accountable for the occurrence of the fault.

Advantageously, in a first embodiment of the invention, the voltage regulator, the current limiter and crowbar short-circuit device are adapted to operate autonomously and independently of the means of calculation and storage and said means of calculation and storage are adapted for logging, in said non-volatile memory, the date and the operating parameters of the power supply unit for the equipment over a predetermined period. In this version of the protective device, the means of protection operates autonomously and in parallel to the part for logging failures. The operating parameters are logged on a rolling basis over a predetermined period or number of logs.

In one variant of this first embodiment of the invention, the voltage regulator, the current limiter and the crowbar short-circuit device are adapted to generate an interrupt signal towards the means of calculation and storage when they are activated, said signal activating the logging of the date and operating parameters of the power supply for the equipment in said non-volatile memory. In this variant, the device logs a "photograph" of the device status when at least one of the means of protection is activated, i.e. at the moment when a fault occurs.

In a second embodiment of the device according to the invention, the voltage regulator, the current limiter and the crowbar short-circuit device are adapted to be controlled by the means of calculation and storage according to the operating parameters of the power supply for the equipment and their comparison with the predetermined values, the logging of the date and of the operating parameters of the power supply for the equipment in said non-volatile memory being managed by the means of calculation and storage. In this embodiment, the device offers the advantage of being entirely programmable, in terms of the operating limits as well as the frequency and quantity of records retained.

Advantageously and according to the invention, the means of calculation and storage additionally comprise a non-modifiable memory adapted for permanently registering a piece of information for identifying the protected equipment. In this way, the monitoring and protective device may be linked in a tamper-resistant way, according to the invention, to the equipment that it protects.

Advantageously and according to the invention, the voltage regulator comprises a control input and the means of calculation and storage are adapted for controlling the connection to or disconnection from the power supply of the equipment according to the occurrence of predetermined events. This characteristic, combined with the presence of a clock in the means of calculation and storage, enables operating time slots for the operation or shutdown of the protected equipment to be programmed without additional cost.

Advantageously and according to the invention, the monitoring and protective device comprises at least one sensor adapted for measuring an environmental parameter of the equipment and/or of the device. For example, the sensor is one of the set of sensors for temperature, hygrometry and acceleration.

Advantageously and according to the invention, the means of calculation and storage are adapted for comparing the value of said parameter with the predetermined limits and for controlling the connection to or disconnection from the power supply of the equipment in the event of said limits being exceeded by said parameter. It is therefore possible to disconnect equipment from the power supply when the ambient temperature, humidity or acceleration (in the event of the equipment falling, for example) exceeds a predetermined threshold and to reconnect the equipment to the power supply when the environmental conditions are once more acceptable.

Advantageously and according to the invention, the means of calculation and storage are additionally adapted for logging the instant of occurrence and nature of a fault in the environment of the equipment. In this way, it is possible to know whether a failure was caused by the equipment being exposed to environmental conditions outside its specifications.

Advantageously and according to the invention, the monitoring and protective device comprises a means of communication adapted for establishing a link for exchanging information with an external system. This means of communication, for example in the form of a wired serial link, USB or even a wireless link (WIFI, GSM, etc.) enables the device to be programmed as well as the data logged in its memory to be collected. This means of communication may also be linked, via an external computer and/or a network (LAN, WAN), to remote monitoring or other systems.

Advantageously and according to the invention, the monitoring and protective device additionally comprises a means of signalling adapted for signalling the instant of occurrence and the nature of a fault in the power supply and/or in the environment of the equipment. Depending on the nature and cost of the protected equipment, the signalling of a fault may range from a simple audible signal (beep) or warning lights, to remote signalling using the aforementioned means of communication.

Advantageously and according to the invention, the monitoring and protective device comprises an autonomous power source that is independent of the power source to which it is connected. In this way, even if the power supply line is cut off—by the fuse being blown due to the crowbar short-circuit device, for example—the means of calculation and storage remains operable for a sufficient period to back up the data acquired at the time of the fault.

Advantageously and according to the invention, the monitoring and protective device is miniaturized and integrated in a housing of a power connector of the equipment to be protected.

The invention likewise extends to a method for implementing a device for monitoring and protecting electrical equipment such as described above, wherein it comprises:
 a step for initialization of the device during which a program and operating limit values are recorded in a non-volatile memory,
 a step for the identification of the protected equipment by the device during which a piece of information for identifying said equipment is recorded in a non-volatile memory and is non-modifiable,
 a monitoring and protection step during which the parameters for the power supply and environment of the protected device are gathered and compared to the operating limit values registered at the initialisation step,
 a step for the logging and signalling of a fault, initiated by the occurrence of a fault caused by a power supply and/or environmental parameter exceeding the registered operating limit values,
 a step for restitution and analysis of the fault, during which an initial cause for the fault is determined on the basis of the parameters logged at the time the fault occurred.

The invention likewise relates to a device and a method for monitoring and protecting electrical equipment, characterized jointly by one or more of the features mentioned above or below.

Further objectives, features and advantages of the invention will emerge from the description which follows and from the accompanying drawings, in which.

Figure 1:
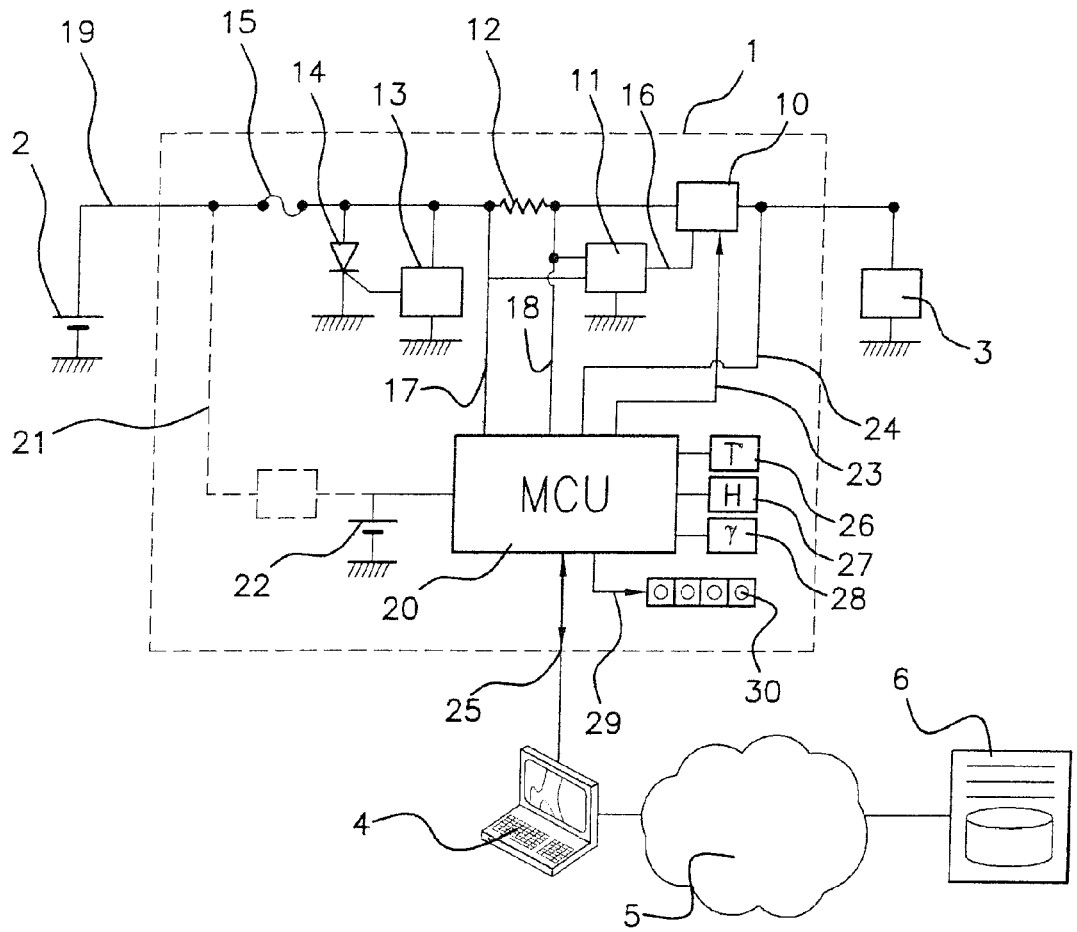
FIG. 1 is a schematic diagram of a device according to the invention.

FIG. 1 is a schematic diagram showing a device 1 for monitoring and protecting electrical equipment 3 according to a first embodiment. The device 1 is placed in series on a power supply line 19 between a power source 2, which is—for example—a stabilised power supply that supplies electrical power to different items of equipment that make up a computer, such as motherboard, processor, hard disk, optical disk, etc. and an item of equipment 3 which, in the example described, is a hard disk of a computer.

Starting from the connection to the equipment 3, the device 1 comprises—in series on the power supply line 19—a voltage regulator 10, the measurement resistance 12 of a current limiter 11 and a fuse 15. The fuse 15 is connected at one end to the power source 2, and at the other end to the anode of a thyristor 14, the cathode of which is connected to ground. The thyristor 14 provides crowbar short-circuit protection by means of an overvoltage detector 13. The overvoltage detector 13 is connected between the power supply line 19 and ground and comprises a control terminal connected to the thyristor gate 14.

The current limiter 11 measures the power supply current circulating in the power supply line 19 by the drop in voltage on the measurement resistance terminals 12. Other well-known methods of measuring the current could be employed by those skilled in the art, such as—for example—a current mirror. The current limiter 11 is adapted to cooperate with the voltage regulator 10 via a coupling line 16, enabling the output voltage of the voltage regulator 10 to be modified if the supply current exceeds a predetermined limit value.

The voltage regulator 10 receives an input voltage delivered by the power source 2, and outputs a regulated power supply voltage to the equipment 3. The regulator, in a manner that is known per se, comprises an integral transistor (or equivalent) in series between the input and output of the regulator, said transistor being adapted to operate in switching or linear mode according to the input voltage.

Figure 2:
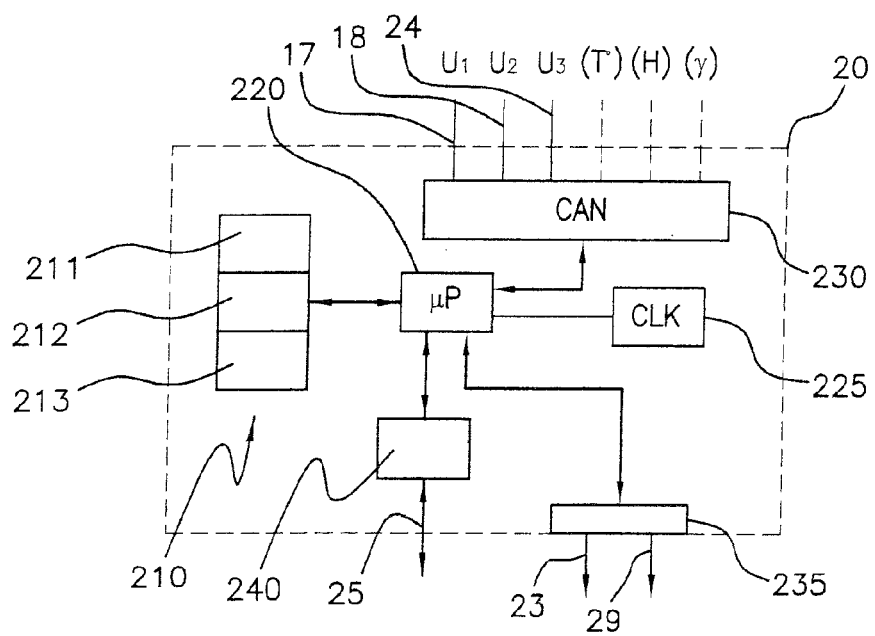
FIG. 2 is a schematic diagram of the means of calculation and storage of the device according to the invention.

The monitoring and protective device shown in FIG. 1 likewise comprises means of calculation and storage in the form of a microcontroller 20, the structure and function of which will be described in detail with reference to FIG. 2. The microcontroller 20 is supplied by an autonomous power source 22, for example a lithium battery or battery pack, which is independent of the power source 2. In this way, even if the power supply line 19 is cut off, the microcontroller continues to be powered and can complete operations after a fault has occurred. The autonomous power source 22 may likewise be used to power the components (signalling, communication, etc.) of the device 1 that need to remain operational following a fault.

The microcontroller 20 essentially comprises a memory block 210, a processor 220, a clock 225, an analogue-to-digital converter 230 comprising multiple inputs, a control interface 235 and a communication interface 240.

The memory block 210 comprises a number of memory zones offering distinct features. For example, a first memory zone, referred to as non-modifiable memory 211, is implemented by PROM-type memory circuits, write-once and non-erasable, adapted to contain data for identifying the monitoring and protective device 1, such as its serial number, and the identification data of the equipment that it is protecting (manufacturer, model, serial number, etc.)

The memory block 210 further comprises a second memory zone referred to as program memory 212, of EEPROM or Flash memory type, non-volatile, adapted to contain the operating program of the microcontroller as well as permanent data such as the operating limit values of the device 1 (upper and lower operating values for voltage, upper operating value for current, safety limit value, etc.) This data and the operating program are generally written to the memory at the factory, at the time of manufacture of the device 1. It may nevertheless be updated when the device is in use, but access to this memory zone may be subjected to a process of identification and/or authorization in order thereby to control the conditions for modification.

A third memory zone, referred to as working memory 213, non-volatile, for example of the same type as program memory 212, is adapted to receive the numerical values representing the operating parameter measurements of the device 1 and of the equipment 3 as well as date information associated with these measurements.

The clock 225 of the microcontroller is adapted to supply date-and-time stamping information including—for example—year, month, day, minute and second, thus enabling the instant at which an event occurs, as well as the instant at which a measurement is taken, for example, to be dated as accurately as possible.

The analogue-to-digital converter 230 is adapted to receive and to measure, on input, the operating parameters of the device 1 and of the equipment 3. It receives the input voltage from the device via a measurement line 17 connected to the joint terminal of the power source 2 and the resistor 12, the voltage on the other terminal of the resistor 12 via a measurement line 18, enabling the current circulating in the power supply line 19 to be calculated, and the power supply voltage for the equipment 3 via a measurement line 24 connected to the joint terminal of the voltage regulator 10 and the equipment 3.

The analogue-to-digital converter 230 is likewise adapted to receive and measure the values representing the environmental parameters of the device 1 delivered via the sensors incorporated in the device, such as a sensor for temperature 26, hygrometry 27 or acceleration 28, or indeed any other type of sensor suitable for measuring a physical parameter that may be relevant in the usage environment of the equipment 3.

The microcontroller 20 likewise comprises a control interface 235 adapted to deliver control signals to certain components of the device 1, and—in particular via the control line 23—a control signal to the voltage regulator 10 enabling the equipment 3 to be connected to or disconnected from the power supply. The control interface is likewise adapted for controlling, via a control line 29, a signalling block 30 comprising one or more LEDs or a buzzer.

The microcontroller 20 additionally comprises a communication interface 240 enabling the device 1 to be connected, via a physical or virtual communication line 25, to an external system such as a computer 4, which is in turn connected—for example—to a server 6 via a network 5 (internet or private network). This communication interface may be wired according to the known standards (USB, RS232 or others) or, if appropriate, may be wireless of the type WIFI, GSM, Bluetooth, ZigBee, etc.

In a first embodiment of the device of the invention, the protective means formed by the voltage regulator 10, the current limiter 11 and the circuit breaker comprising the fuse 15, the thyristor 14 and the overvoltage detector 13, are adapted to operate autonomously and independently of the microcontroller 20. In this case, the components forming the protective means are selected or adjusted to delimit the operating values of the device according to the equipment to be protected.

The voltage regulator 10, is adapted, for example, to deliver a power supply voltage to the equipment 3 according to the specifications of the latter, for example 5±0.5 volts for a hard disk. The regulator is adapted to operate with an input voltage supplied by the power source 2, which is between a lower operating value (for example 4.5V) and an upper operating value (for example 7.5V). If an input voltage is lower than the lower operating value, the regulator is adapted to cut off the power supply to the equipment. If an input voltage exceeds the upper operating value, the regulator is likewise adapted to cut off the power supply to the equipment. If an input voltage is between 5.5V and the upper operating value, for example, the regulator operates in linear mode within the limits of the power that it can dissipate. If this power is exceeded, the regulator likewise cuts off the power supply to the equipment.

The voltage regulator 10, however, is restricted with regard to the maximum input voltage that it can tolerate, even if the power supply to the equipment 3 is cut off. For example, a failure in the power source that would result in the presence of a 220V voltage range on the power supply line 19 would lead to the destruction of the regulator and of the equipment connected to it. To protect against this eventuality, the overvoltage detector 13 is adapted to control the thyristor gate 14 when the input voltage exceeds a safety limit value that is higher than the upper operating value of the regulator but lower than the maximum voltage that can be tolerated by the regulator in blocked status. As soon as this safety limit value is exceeded, therefore, the thyristor 14 is commanded to short-circuit, causing a short-circuit current in the fuse 15, which melts and isolates the downstream circuits, i.e. the main part of the device 1 and the equipment 3, from the power source.

If, for example, owing to an internal failure in the equipment 3, the latter short-circuits (even partially), the power supply current absorbed by the equipment may increase and exceed an upper operating value. In order to protect not only the power source 2 but also the parts of the equipment 3 that may overheat as a result of this short-circuit, the current limiter 11, via the coupling line 16, causes the voltage on the voltage regulator terminals to drop in order to reduce the power supply voltage of the equipment 3 and concomitantly to reduce the current passing through it. If the short-circuit disappears, the current absorbed by the equipment 3 is reduced and the assembly returns to normal. If the current continues to increase, the upper voltage and/or power limits of the voltage regulator 10 are exceeded and the regulator interrupts the power supply to the equipment.

In this first embodiment, the protective means of the device 1 operates autonomously according to limit values that are set at the time of manufacture of the device. At that time the microcontroller 20 receives an operating program and data representing these value limits, which are stored in the memory zone 212.

During operation of the monitoring and protective device 1, the microcontroller 20 periodically measures the different operating parameters (input voltage, consumed current, power supply voltage of the equipment, and—if appropriate—temperature, humidity, acceleration, etc.) and logs the value and the date of measurement in the working memory 213. These logs are carried out on a rolling basis, i.e. when the working memory is full, each new record replaces the oldest record previously logged.

For each measurement carried out, the microcontroller 20 compares the value of the measurement to the limit values logged in its program memory. If at least one of these limits is exceeded, a fault is recorded. Several types of handling might be envisaged depending on the microcontroller program: the corresponding log may be marked as non-erasable and preserved for later use, or—if the fault is identified as being critical, for example—all the preceding logs are backed up, etc. For example, an input voltage measurement showing a positive peak followed by one or more measurements with a value close to zero indicates that the crowbar short-circuit device has been triggered and the fuse 15 blown. Alternatively, a sharp drop in current consumption accompanied by a positive peak in the power supply voltage of the equipment 3 might be considered to be indicative of a fault (open circuit) in the power input of the equipment 3.

Thus it may be seen that, by analyzing the records logged by the microcontroller 20, it is possible to determine the type of fault that occurred and its possible origin (on the side of the power source 2 or the equipment 3). Similarly, the concomitant logging of environmental parameter values (temperature, hygrometry, acceleration, etc.) is able to provide information as to possible external causes of the fault.

The monitoring and protective device 1 may likewise be programmed whereby the surpassing of a limit value by one of the environmental parameters measured by the microcontroller 20 causes the protected equipment to be secured. For this purpose, the voltage regulator 10 includes a control input connected by the control line 23 to the control interface 235 of the microcontroller. This command enables the voltage regulator 10 to be forced to interrupt the power supply to the equipment 3. The microcontroller 20 is thus adapted to cause the equipment 3 to be disconnected from the power supply when one of the monitored environmental parameters exceeds a limit value programmed in the program memory 212, and to be reconnected when the parameter value returns to normal. Of course, each command is the subject of a record in the working memory, comprising at least the date and the nature of the environmental fault recorded, as well as the parameter values measured at the instant when the fault occurred.

Furthermore, since the microcontroller 20 incorporates a clock that is capable of delivering a time signal, it is possible to connect the equipment to (or disconnect it from) the power supply at predetermined times without additional equipment, for example by programming the date values in the program memory 212 and performing a comparison of the current date with these values. The programming of these date values may be advantageously implemented via the communication interface 240 of the microcontroller, for example by means of the external system 4 or of a dedicated piece of equipment. Of course, events other than dates or limit excesses may be programmed into the microcontroller 20, so that when such events occur the microcontroller is adapted to command that the equipment 3 be connected to or disconnected from the power supply.

In one variant of this first embodiment of the monitoring and protective device according to the invention, the protective means formed by the voltage regulator 10, the current limiter 11 and the circuit breaker comprising the fuse 15, the thyristor 14 and the overvoltage detector 13 are connected in parallel by an interrupt line (not shown) connected to the microcontroller 20 and adapted to initiate an interrupt of the processor 220 and to command the execution of a predetermined routine when at least one of the protective means is activated. For example, when the voltage regulator 10 cuts off the power supply to the equipment 3 as the result of an input voltage being outside the set limits, or when the current limiter 11 commands the regulator to lower the power supply voltage to the equipment 3, or even when the overvoltage detector 13 controls the thyristor gate 14, the interrupt line status changes and forces the microcontroller 20 to execute a handling routine for the fault in which the power supply and environmental parameter values of the device are measured by the analogue-to-digital converter 230 and logged in the working memory 213 at the same time as the current date supplied by the clock 225. In this variant, conversely to the main embodiment in which the data is logged continuously, logging is triggered by the occurrence of a fault. The device may be programmed to memorize one or more logs consecutively. In this way the working memory is not called upon continuously and only the measurements subsequent to the occurrence of the fault are logged.

In a second embodiment of the invention, the protective means of the device is controlled by the microcontroller 20. In this embodiment, as in the preceding one, the microcontroller 20 periodically measures the different operating parameters (input voltage, consumed current, power supply voltage of the equipment, and—if appropriate—temperature, humidity, acceleration, etc.) and compares the value measured to the limit values recorded in its program memory. However, the protective means is adapted to be controlled by the outputs on the control interface 235 of the microcontroller. For example, the thyristor gate 14 is directly controlled by the microcontroller when the voltage measured on the measurement line 17 exceeds a predetermined threshold. The overvoltage detector 13 is then no longer necessary. Likewise, the control of the voltage regulator 10 may be adapted to control it in a linear way and not on an all-or-nothing basis. In this way, the microcontroller 20 can control the output voltage of the regulator and therefore the power supply voltage of the equipment 3 according to the difference in voltage on the measurement resistance 12 (representing the power supply current) and the absolute value of these voltages. In the same way, the microcontroller 20 controls the connection to or disconnection from the power supply of the equipment 3 according to the environmental parameter measurements (temperature, hygrometry, acceleration, etc.) and their comparison with the limit values recorded in its program memory.

If at least one of these limits is exceeded, a fault is recorded and the microcontroller commands the logging of the different parameters measured as well as the date of occurrence of the fault.

The advantage of this second embodiment of the monitoring and protective device according to the invention lies in its ability to be programmed with the limits adapted to a plurality of items of equipment 3, within a certain range of voltages and currents. In this way, the manufacture of the device may be standardized and its adaptation to the device to be protected may be carried out at the point of connection to the latter.

Figure 4:
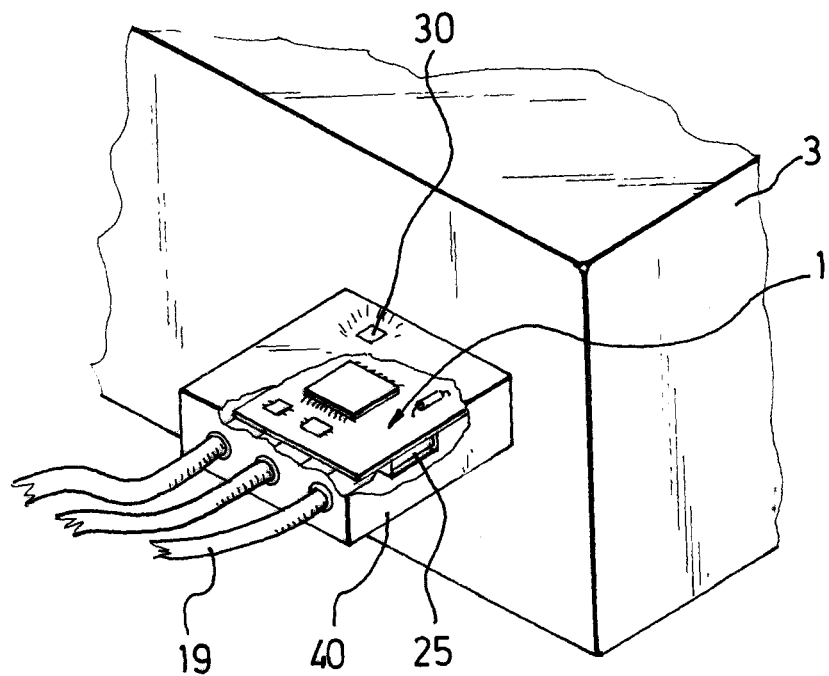
FIG. 4 is a partial view of an item of electrical equipment protected by a device according to the invention, integrated into a power connector.

Whatever the embodiment envisaged for the device, said device is intended to be miniaturized and integrated, as shown in FIG. 4, into a power connector 40 of the equipment 3. The connector 40 receives at least the power supply line 19 from the power source. This power supply line is connected to a substrate, for example a printed or hybrid circuit, forming the monitoring and protective device 1. The device 1 may be advantageously overmoulded to the interior of the connector 40. The output of the device 1 is directly connected to connection pins (not visible in the diagram) of the connector 40 to the equipment 3. The signalling block 30 advantageously consists of a light-emitting diode visible through the overmoulding. A communication line 25, represented in the form of a connector for a wired link, is accessible on the side of the connector 40. Of course, the communication line could also be implemented by a cable parallel to the power supply line 19, or—as seen previously—by any other, wireless, means of communication.

Figure 3:
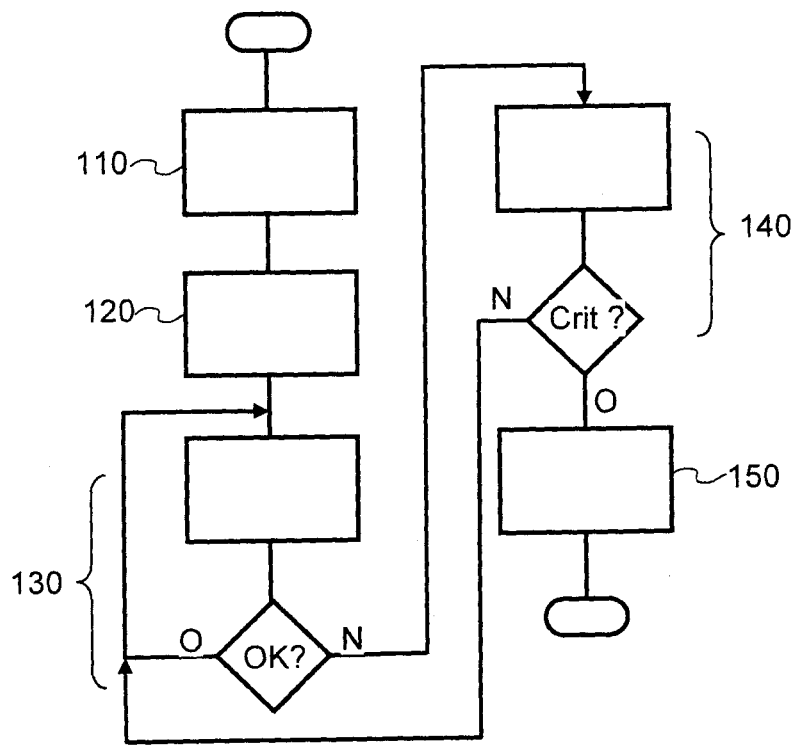
FIG. 3 is a flowchart showing the method for implementation of the device according to the invention.

A method for implementing the monitoring and protective device according to the invention, particularly adapted to support the implementation of an insurance service for the protected equipment, will now be described with reference to FIG. 3.

The method for implementing the device according to the invention comprises a first step 110 to initialize the device, during or on completion of its manufacture. At the time of this initialization, each device 1 is given a serial number which is recorded in its non-modifiable memory 211 such that the device may be uniquely identified. The device is also given at least one part of its operating program. This part consists of a minimum operating program comprising at least all of the instructions enabling the microcontroller 20 to manage its communication interface, for example in order to enable other complementary parts of the program or updates etc. to be downloaded at a later stage. In the case of a device 1 implemented according to the first embodiment of the invention, the operating limit values that correspond to the adjustments to the protective means carried out at manufacture are likewise entered in its program memory 212. Furthermore, as soon as the autonomous power source of the device has been installed, the clock 225 is started up and set to the right time.

It may be seen that, at the end of this initialization step, the device 1 is operational (at least according to a minimum program) and capable of logging measurements relating to its environment if it is equipped with the appropriate sensors. This makes it possible to ensure that the device 1 was not subjected to conditions liable to damage it before its commissioning at the client's premises.

The method for implementing the device 1 then comprises a step for the identification 120 of the equipment 3 to be protected when it is commissioned at the client's premises. At this step, the device 1 is connected in series between the power source 2 and the equipment 3. Its communication line 25 is connected to the external system 4. In a particular case, the external system 4 may be the computer to which the equipment 3 is connected.

During this step 120, different operations are executed. By way of example but not limitation, the minimum operating program may make provision—autonomously or under the control of a special program provided in the external system 4—to identify the type of equipment to which it is connected, for example by reading the identification data stored in the memory of the equipment (manufacturer, model, type, serial number, version, etc.). On the basis of this information, the device 1 is able—via its connection to the external system 4 and beyond, via the internet 5—to download, from a server 6, any complementary program adapted to the equipment 3, as well as (for a device according to the second embodiment, for example) operating limit values appropriate to that equipment.

The device 1, more particularly the microcontroller 20, is adapted for recording the identification data of the equipment 3 to which it is connected, in its non-erasable memory, in such a way as to effect a definitive pairing and to guarantee that the equipment is not substituted in the event of a fault. Furthermore, provision may be made during this identification step to register the device/equipment pairing at a remote site, for example the internet site of an insurance company, together with the data relating to the customer, for any subsequent claim on a guarantee taken out with that insurer.

At the end of these operations, the method for implementing the device moves to a monitoring and protective step 130. In this step, the device 1 executes the operations for measuring the operating and environmental parameters, compares them to the limit values contained in its program memory, and logs these measurement values and the current date in its working memory 213. This step is repeated as long as no faults are detected.

When a fault is detected, whether by the activation of one of the protective means of the device 1, or by a measurement of a power supply or environmental parameter that exceeds one of the limit values logged in the program memory, the method for implementing the device moves to a fault handling step 140 during which at least one of the following fault handling operations is executed: the current log of the measurement values and date is noted as a fault, and—for example—marked as being non-erasable; a fault is signalled by the signalling block 30; if necessary an alarm is transmitted to a remote site via the communication interface 240 and the communication line 25; a sub-program for assessing the criticality of the fault is executed, etc.

If the operating programme of the device 1 provides for such assessment of criticality, depending on this assessment the method may return to the monitoring and protective step, or even disconnect the device and protected equipment from the power supply and move to the next step. If provision is not made to assess the criticality of the fault, enabling the monitoring and protective operations to continue, the method moves to step 150 for restitution and analysis during which an operator or system expert intervenes to extract from the working memory the various items of information logged before and during the fault, and to form an initial interpretation on the basis of these, possibly enabling the causes to be determined and liability to be assigned.

Of course, this description is provided solely by way of illustrative example and those skilled in the art could make numerous modifications to it without departing from the scope of the invention, such as—for example—integrating pre-adjusted limit values in the environmental sensors and adapting these sensors to control the voltage regulator 10 directly in parallel on the control line 23, or even to adapt the operating program of the means of calculation and storage in order to provide several levels of security and/or confidentiality such that the logged data may not be read or modified except by duly authorized persons.

The invention claimed is:

1. Device for monitoring and protecting an electrical equipment, placed in series on a power supply line between an electrical power source and said electrical equipment, comprising:
   at least one voltage regulator having an input terminal receiving an input voltage delivered by said electrical power source, an output terminal supplying a regulated power supply voltage to said electrical equipment, and a control input line for controlling a connection or a disconnection from said input terminal to said output terminal;
   at least one current limiter, coupled to said voltage regulator;
   at least one crowbar short-circuit device; and
   means of calculation and storage adapted for generating a clock and for logging a date of occurrence of a fault and operating parameters of the power supply for the electrical equipment in a non-volatile memory,
   wherein said means of calculation and storage comprises:
   i) a memory means for storing predetermined values of operating parameters of the power supply for said electrical equipment, comprising an input voltage lower operating value, an input voltage upper operating value, a safety limit voltage value that is higher than said input voltage upper operating value and an absorbed current upper value,
   ii) at least one analog to digital converter connected to said power supply line for sensing values of operating parameters comprising said input voltage, an output voltage and of an absorbed current;
   iii) comparison unit for comparing said operating parameters from the analog to digital converter to said predetermined values stored in the memory means; and
   iv) at least one control output line for controlling:
   a) said at least one voltage regulator i) to provide said regulated power supply voltage to the electrical equipment when said input voltage sensed at said input terminal of the voltage regulator is between said input voltage lower operating value and said input voltage upper operating value, and ii) to cut off said regulated power supply voltage when said input voltage is outside a range defined between said input voltage lower operating value and said input voltage upper operating value;
   b) said at least one current limiter, to reduce said regulated power supply voltage when a power supply current absorbed by said electrical equipment exceeds said absorbed current upper value, and
   c) said at least one crowbar short-circuit device, to be activated when said input voltage exceeds said safety limit voltage value to cause a fuse placed in series between the electrical power source and the electrical equipment, to blow,
   wherein, the fuse is located upstream of the voltage regulator, the current limiter, and the crowbar short-circuit device such that when the crowbar short-circuit device is activated and causes the fuse to blow, each of the voltage regulator, the current limiter, the crowbar short-circuit device, and the electrical equipment are isolated from the electrical power source.

2. Device as claimed in claim 1, wherein the means of calculation and storage additionally is adapted for permanently logging information for identifying the protected equipment.

3. Device as claimed in claim 1, further comprising at least one sensor adapted for measuring an environmental parameter of the equipment and/or of the device.

4. Device as claimed in claim 3, wherein the sensor is one of a set of sensors for temperature, hygrometry and acceleration.

5. Device as claimed in claim 3, wherein the means of calculation and storage are adapted to control a connection to or disconnection from the power supply of the equipment if said safety limit voltage value is exceeded.

6. Device as claimed in claim 3, wherein the means of calculation and storage are additionally adapted to log the instant of occurrence and the nature of a fault in the environment of the equipment.

7. Device as claimed in claim 1, further comprising means of communication adapted for establishing a connection for exchanging information with an external system.

8. Device as claimed in claim 1, further comprising a signalization unit adapted to signal the instant of occurrence and the nature of a fault in the power supply and/or in the environment of the equipment.

9. Device as claimed in claim 1, further comprising an autonomous power source that is independent of said electrical power source.

10. Device as claimed in claim 1, wherein the device is miniaturized and integrated into a housing of a power connector of the equipment to be protected.

11. Method for implementing a device for monitoring and protecting equipment as claimed in claim 1, wherein it comprises:
- a step for initialization of the device during which a programme and operating limit values are recorded in the non-volatile memory,
- a step for identification of the protected equipment by the device during which information for identifying said equipment is recorded in non-volatile and non-erasable memory,
- a step for monitoring and protection during which the power supply and environmental parameters of the protected equipment are gathered and digitally compared to the operating limit values recorded at the initialization step,
- a step for the logging and signalling of a fault, initiated by the occurrence of a fault caused by a power supply and/or environmental parameter exceeding the recorded operating limit values, and
- a step for restitution and analysis of the fault during which an initial cause for the fault is determined on the basis of the parameters logged at the time the fault occurred.

12. A device that monitors and protects an electrical equipment, with said device placed in series on a power supply line between an electrical power source and said electrical equipment, said device comprising:
- a voltage regulator having i) an input terminal that receives an input voltage delivered by said electrical power source, ii) an output terminal that supplies a regulated power supply voltage to said electrical equipment, and iii) a control input line that controls a connection and disconnection between said input terminal to said output terminal;
- a current limiter coupled to said voltage regulator;
- a crowbar short-circuit device; and
- a calculation and storage unit that generates a clock and logs, in a memory, a date of occurrence of a fault and the operating parameters of a power supply for the electrical equipment, said calculation and storage unit comprising
  i) a non-volatile memory that digitally stores predetermined operating parameter values of the power supply for said electrical equipment including a) a lower operating value of an input voltage, b) an upper operating value of the input voltage, c) a safety limit voltage value that is higher than said upper operating value of the input voltage, and d) an upper value of absorbed current,
  ii) an analog to digital converter connected to said power supply line that senses values of operating parameters comprising said input voltage, an output voltage, and the absorbed current;
  iii) a comparison unit that digitally compares a) said operating parameters from the analog to digital converter to b) said predetermined operating parameter values stored in the memory; and
  iv) a control output line connected at least to the control input line of the voltage regulator and that controls
    a) said voltage regulator to i) provide said regulated power supply voltage to the electrical equipment when said input voltage sensed at said input terminal of the voltage regulator is between said lower and upper operating values of the input voltage, and ii) cut off said regulated power supply voltage when said input voltage sensed at said input terminal of the voltage regulator is outside a range defined between said lower and upper values;
    b) said current limiter to reduce said regulated power supply voltage when a power supply current absorbed by said electrical equipment exceeds said upper value of absorbed current, and
    c) said crowbar short-circuit device to be activated when said input voltage exceeds said safety limit voltage value to thereby cause a fuse placed in series between the electrical power source and the electrical equipment to blow,
  wherein, the fuse is located upstream of the voltage regulator, the current limiter, and the crowbar short-circuit device such that when the crowbar short-circuit device is activated and causes the fuse to blow, each of the voltage regulator, the current limiter, the crowbar short-circuit device, and the electrical equipment are isolated from the electrical power source.

* * * * *